United States Patent [19]

Itoh

[11] Patent Number: 5,309,986
[45] Date of Patent: May 10, 1994

[54] HEAT PIPE

[76] Inventor: Satomi Itoh, 14-2-306, Asahigaoka-machi, Ashiya-shi, Hyogo, Japan

[21] Appl. No.: 982,861

[22] Filed: Nov. 30, 1992

[51] Int. Cl.$^5$ .............................................. F28D 15/02
[52] U.S. Cl. ........................... 165/104.26; 165/104.33; 361/699; 122/366
[58] Field of Search ...................... 165/104.26, 104.33; 122/366; 361/385

[56] References Cited

U.S. PATENT DOCUMENTS

| | | | |
|---|---|---|---|
| 3,450,195 | 9/1969 | Schnacke | 165/104.26 |
| 4,212,347 | 7/1980 | Eastman | 165/104.26 |
| 4,489,777 | 12/1984 | Del Bagno et al. | 165/104.26 |
| 4,805,691 | 2/1989 | Cook et al. | 165/104.26 |

Primary Examiner—Albert W. Davis, Jr.
Attorney, Agent, or Firm—W. G. Fasse; W. F. Fasse

[57] ABSTRACT

A heat pipe includes an air tight elongated container and a heat carrier sealed in the container. The elongated container has a flat bottom wall serving as a heat receiving portion and a top wall serving as a heat dissipating portion. A liquid passage for moving condensed heat carrier in a slanted direction and parallel directions with respect to the longitudinal axis by capillary action is provided on the inner wall surfaces of the container. The heat carrier which has been condensed into liquid flows along the liquid passage to be distributed entirely over the bottom wall surface where it efficiently absorbs heat to be evaporated again.

9 Claims, 4 Drawing Sheets

HEAT PIPE

FIELD OF THE INVENTION

The present invention relates to a heat pipe for radiating heat of an electronic component such as a semiconductor integrated circuit package to the atmosphere.

BACKGROUND INFORMATION

Recently, a higher responsiveness and a higher integration of integrated circuits used for electronic devices such a computers have been in greater demand. Accordingly, the power consumption of an integrated relative to the circuit has been increased, and the temperature of the electronic component in operation has been increased. In order to cool the electronic component, a radiating device has been used.

A heat pipe has been known as an example of a radiating device for cooling an electronic component. A heat pipe is obtained by reducing the internal pressure in an air tight container formed by closing both ends of a pipe, and by sealing a heat carrier such as water of alcohol, called a working fluid into the container. At a heated portion of the heat pipe, the working fluid evaporates into steam or gas which moves away from the heated portion of the heat pipe and toward a cooler portion of the heat pipe where it condenses again into liquid to dissipate heat. The liquid returns to the heated portion because of capillary action. By the repetition of this action, heat received from an electronic component at the heated portion is radiated to the atmosphere at the cooler portion of the heat pipe.

A heat pipe is placed on a top surface of an electronic component in order to cool the electronic component such as a semiconductor integrated circuit package. Since a conventional heat pipe has a circular or an oval cross section, it contacts the electronic component along a line. Therefore, not much heat is transmitted from the electronic component to the heat pipe.

Conventionally, one heat pipe is used for one electronic component to cool the respective electronic component. Therefore, a large number of heat pipes have been used in a device including a large number of electronic components, which leads to higher production costs.

SUMMARY OF THE INVENTION

It is an object of the present invention to improve the efficiency in receiving heat of the heat pipe.

Another object of the present invention is to improve heat radiating characteristic of a heat pipe.

A further object of the present invention is to provide a heat pipe which can cool a plurality of electronic components simultaneously.

A heat pipe in accordance with the present invention includes a an air tight container, and a heat carrier sealed in the container. The air tight container has a flat bottom wall serving as a heat receiving portion and a top wall opposite to the bottom wall. Both walls extend in the longitudinal direction. Liquid passages for moving condensed heat carrier in a slanted direction and in a parallel direction relative to a longitudinal axis are formed on inner wall surfaces of the heat pipe container.

Since the bottom wall area of the container is in surface contact with the electronic component, the heat can be efficiently transmitted from the electronic component to the heat pipe. The heat carrier which has been in the liquid phase is heated by the heat transmitted from the electronic component and evaporates to form steam or gas, which moves away from the heated portion to the cooler portion where condensation heat is radiated and dissipated as the heat carrier is condensed to again form a liquid.

The condensed liquid returns to the heated portion through the liquid passages by capillary action. Since the liquid passages moves the condensed liquid in slanted and parallel directions as mentioned above the condensed liquid is distributed over the entire heated portion whereby the heat carrier is again heated and efficiently evaporated.

According to another aspect of the present invention, the heat pipe simultaneously cools a plurality of electronic components arranged linearly and spaced apart from each other. The heat pipe includes in addition to the air tight elongated container and the heat carrier sealed in the container, a plurality of heat radiating fins. The container has at least a flat bottom wall in contact with top surfaces of a plurality of electronic components, and a top wall opposite to the bottom wall. The plurality of heat radiating fins are attached to outer surfaces of those regions of the elongated container which are not positioned on the electronic components. Liquid passages for moving condensed heat carrier in slanted directions and in parallel directions relative to the longitudinal axis by capillary action are formed on the inner wall surfaces of the container.

The heat pipe simultaneously cools a plurality of linearly arranged electronic components. Since a plurality of heat radiating fins are attached on the outer surfaces of the container, a substantially improved heat radiating characteristic is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
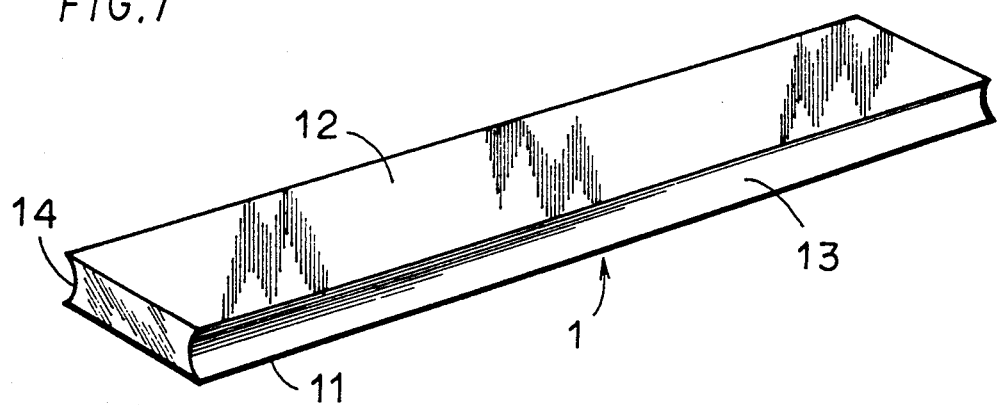
FIG. 1 is a perspective view showing a first embodiment of a heat pipe in accordance with the present invention.
Figure 2:
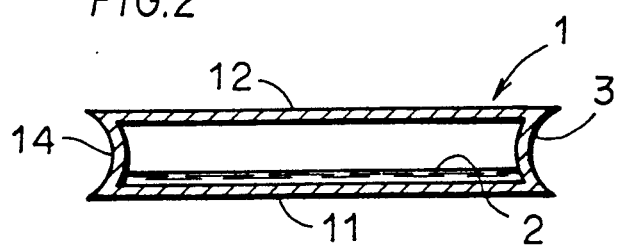
FIG. 2 is a cross section through the heat pipe of FIG. 1.

The heat pipe shown in FIGS. 1 and 2 includes an air tight container 1 and a heat carrier 2 sealed in the air tight container 1. In the state of FIG. 2, the heat carrier 2 is in the liquid phase.

Figure 3:
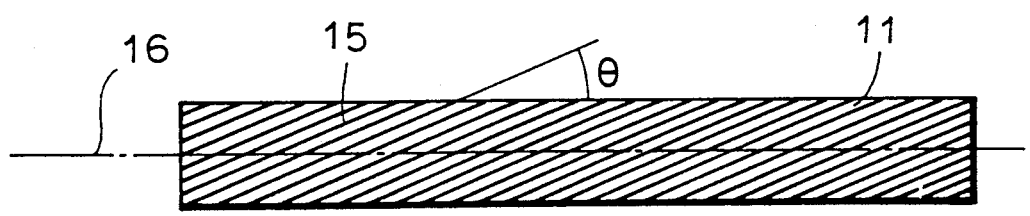
FIG. 3 is a plan view showing an inner surface of the bottom wall of an elongated container forming the heat pipe.
Figure 4:
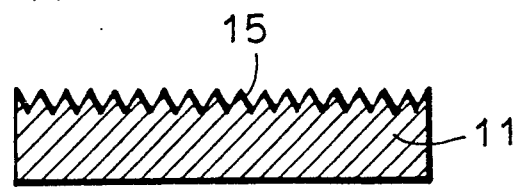
FIG. 4 is a cross section through the bottom wall of FIG. 1.

The container has an elongated shape, a flat bottom wall 11 serving as a heat receiving portion and a top wall 12 opposite to the bottom wall 11. The bottom wall 11 and the top wall 12 are connected with each other by a pair of side walls 13 and 14 arching inwardly toward a central longitudinal axis of the container. Liquid passage elements for moving condensed heat carrier at a slant to and in parallel to the longitudinal axis function by capillary action. The passages are formed on all inner wall surfaces of the container 1. More specifically, referring to FIG. 3 showing the inner surface of the bottom wall 11, a plurality of grooves 15 extending diagonally with respect to the longitudinal axis 16 are formed on the inner surface of the bottom wall 11. Although not shown, similar grooves are formed on the inner surface of the top wall 12 as well as on the inner surfaces of the pair of side walls 13 and 14. These grooves on the top and/or side walls may extend in parallel to the central longitudinal axis. Although the groove 15 has a V-shape in the example of FIG. 4, the groove shape is not limited thereto. The angle $\theta$ formed by the longitudinal axis 16 and the groove 15 is preferably in a range from 10° to 30°. The optimum range of the angle is from 15° to 20°. The liquid condensed in the container 1 flows along the groove 15 by capillary action.

As shown in FIG. 2, the pair of side walls 13 and 14 provide acute or sharp corners with the bottom wall 11 and with the top wall 12. Such an acute corner is provided in order to cause capillary action. The liquid condensed in the container 1 flows in the longitudinal direction along the acute corner by the capillary action. The acute angle should preferably be in the range from 50° to 70°.

Figure 5:
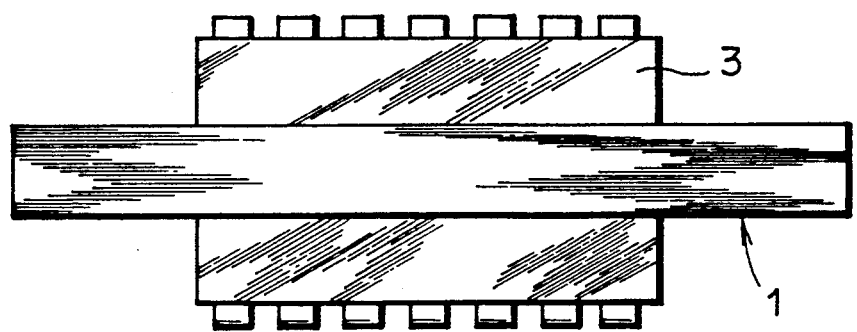
FIG. 5 is a plan view showing the heat pipe of FIG. 1 placed on a semiconductor integrated circuit package.
Figure 6:
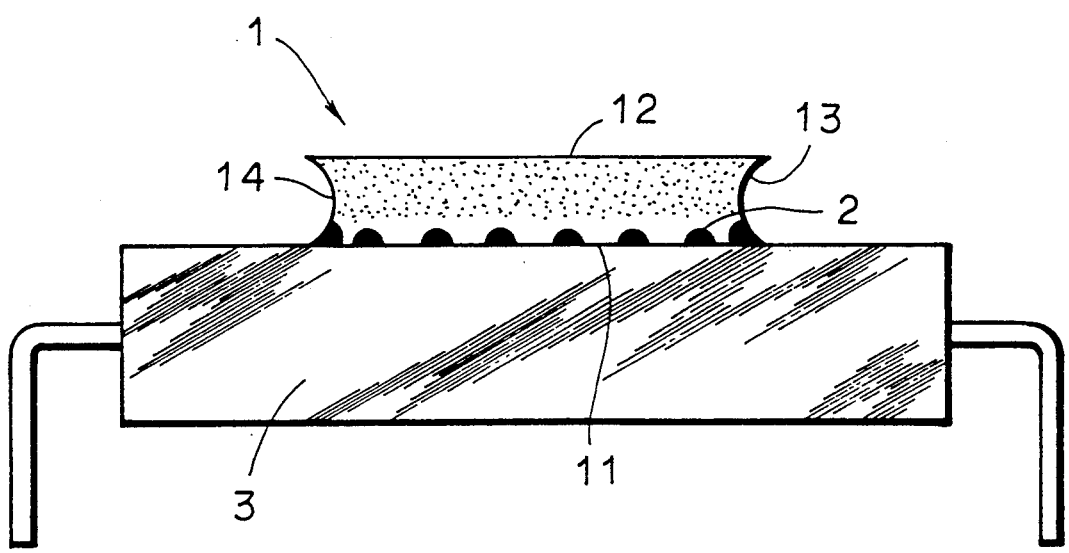
FIG. 6 is a cross section through FIG. 5.

Referring to FIGS. 5 and 6, the operation of the heat pipe will now be described. Since the bottom wall 11 of the container 1 is in surface contact with the top surface of the semiconductor integrated circuit package 3, heat is efficiency transmitted from the semiconductor integrated circuit package to the bottom wall 11. The heated bottom wall 11 heats the heat carrier 2 which is in the liquid phase. Consequently, the heat carrier 2 evaporates and turns to steam or gas. The gas fills the container 1 and transmits heat to the top wall 12 and to the side walls 13 and 14. Thus the heat is radiated to the atmosphere. The gas or steam condenses again at the top wall 12 and the side walls 13, 14 and the respective liquid is returned to the bottom wall 11.

The liquid which has returned to the bottom wall 11 flows in the longitudinal direction along the acute corners between each of the side walls 13 and 14 and the bottom wall 11 as well as along the grooves 15 formed on the inner surface of the bottom wall 11. In this manner, the liquid is distributed entirely over the inner surface of the bottom wall 11, efficiently absorbing heat from the bottom wall 11. By the repetition of such operation, the heat of the semiconductor integrated circuit package 3 is radiated to the atmosphere.

An Ag coating film should preferably be formed entirely over the walls of the container 1 at least on the outer surfaces thereof in order to improve its strength against buckling.

Figure 7:
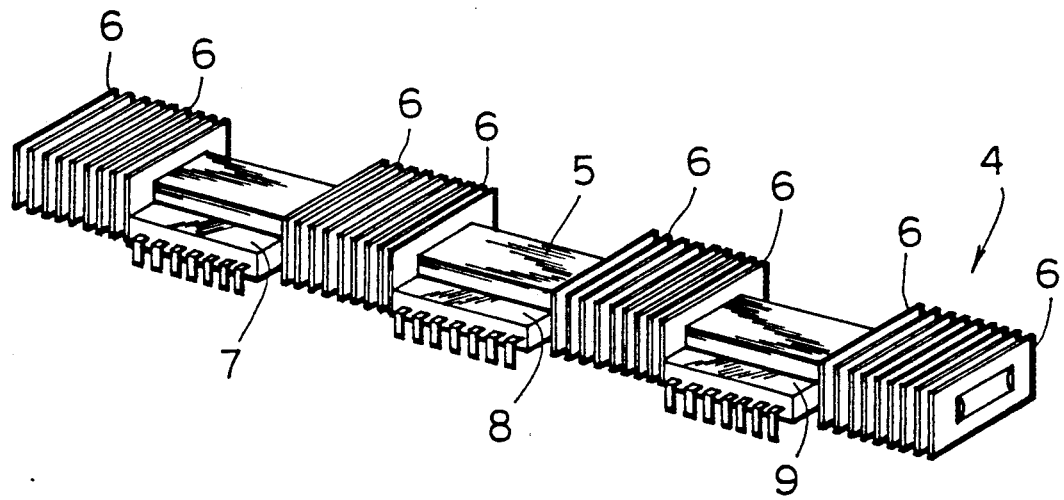
FIG. 7 is a perspective viewing showing the heat pipe of FIG. 1 placed in heat exchange contact and a plurality of semiconductor integrated circuit packages.
Figure 8:
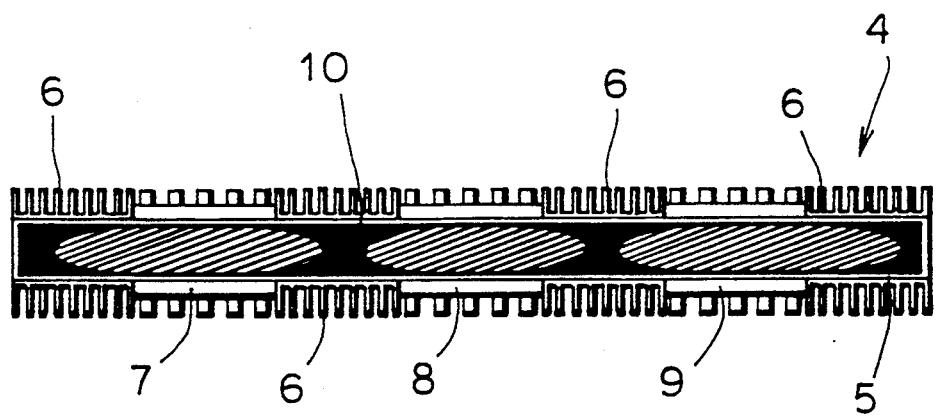
FIG. 8 is a plan view of the illustration of FIG. 7 with the top wall of the heat pipe shown in FIG. 7 removed.

FIGS. 7 and 8 show another example of the use of a heat pipe. The heat pipe shown in these figures simultaneously cools a plurality of semiconductor integrated circuit packages 7, 8 and 9 which are arranged linearly and spaced apart from each other. The heat pipe 4 includes an air tight container 5, a heat carrier sealed in the air tight container, and a plurality of heat radiating fins 6. The heat radiating fins 6 are attached to outer surfaces of those portions of the container which are not positioned in contact with the semiconductor integrated circuit packages 7, 8 and 9.

The structure of the container 5 is the same as the container 1 shown in FIGS. 1 to 3. The heat pipe 4 shown in FIG. 7 exhibits a superior radiating characteristic, since it includes heat radiating fins 6. The flow of the condensed heat carrier 10 can be well understood from FIG. 8. Heat is removed from the steam or gas in the container 5 in the region where heat radiating fins 6 are attached whereby the steam or gas is condensed into liquid. The liquid flows in the longitudinal direction along the acute corners formed between the side walls and the bottom wall as well as along the grooves formed on the bottom wall. In this manner, the condensation heat integrated in the heat generated in the regions where the heat radiating fins 6 are located is dissipated entirely into the fins and thus to the atmosphere. The cooled liquid is uniformly distributed over the bottom surface where it absorbs heat and is evaporated again.

Figure 9:
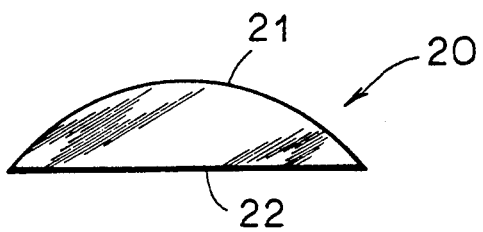
FIG. 9 illustrates an end view of another embodiment of a heat pipe of the invention having an arched top wall.

A heat pipe 20 shown in FIG. 9 includes a top wall 21 and a bottom wall 22, but not any side wall. As shown in FIG. 9, the top wall 21 has an arched shape with both edges connected to the bottom wall 22. The acute corners thus formed between the top wall 21 and the bottom wall 22 moves the condensed heat carrier in the direction parallel to the longitudinal axis by capillary action.

Figure 10:
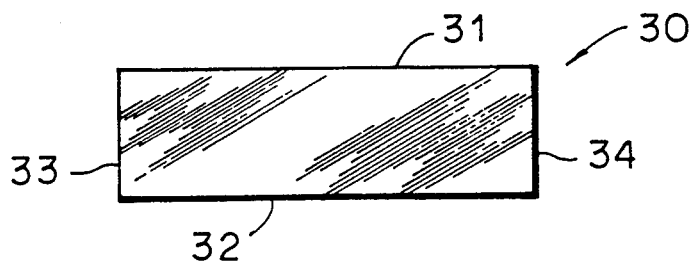
FIG. 10 illustrates an end view of still another embodiment of a heat pipe of the invention having a rectangular cross section.
Figure 11:
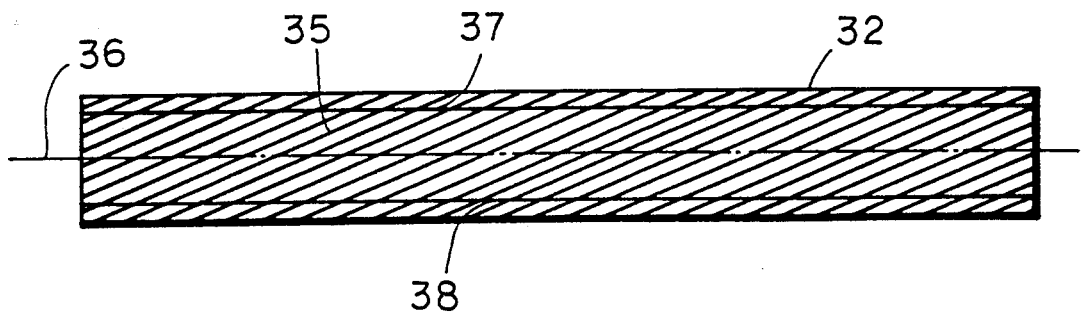
FIG. 11 is another plan view of a bottom wall of a container for the present heat pipe.

A heat pipe 30 shown in FIGS. 10 and 11 includes a container having a rectangular cross section formed by a top wall 31, a bottom wall 32, and a pair of side walls 33 and 34. The angle at each corner of the container is 90°. Therefore, capillary action cannot be expected at these corners. Accordingly, as shown in FIG. 11, grooves 37 and 38 extending parallel to the longitudinal axis 36 are formed in addition tot he grooves 35 extending diagonally to the axis 36 on the inner surface of the bottom wall 32. The condensed liquid flows in the longitudinal direction along the grooves 37 and 38. Although not shown, grooves 35, 37 and 38 shown in FIG. 11 are also formed on the inner surfaces of the top wall 31 of the container.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heat pipe, comprising an air tight elongated container having a longitudinal axis, a flat bottom wall forming a heat receiving portion and a top wall opposite said bottom wall, and side walls interconnecting said top and bottom walls extending in a longitudinal direction; a heat carrier fluid sealed in said container; liquid passage means on inner wall surfaces of said container for moving by capillary action condensed heat carrier fluid in directions at a slant and in parallel to said longitudinal axis, at least one of said side walls having an inwardly concave shape with outwardly reaching side wall edges joined to said bottom wall and to said top wall to form an acute corner along each of said top wall and said bottom wall, each corner defining an inwardly open capillary groove for transporting condensed heat carrier fluid in a direction parallel to said longitudinal axis by capillary action.

2. The heat pipe according to claim 1, wherein said liquid passage means includes a plurality of grooves extending at a slant with respect to said longitudinal axis on the inner surface of said top wall and on the inner surface of said bottom wall.

3. The heat pipe according to claim 2, wherein said slant of said grooves forms an angle relative to said longitudinal axis within the range of 10° to 30°.

4. The heat pipe according to claim 1, wherein said acute corner defines an inwardly open angle in the range of 50° to 70°.

5. The heat pipe according to claim 1, wherein said liquid passage means includes grooves extending parallel to said longitudinal axis on the inner surface of said bottom wall and the inner surface of said top wall.

6. The heat pipe according to claim 1, wherein
said container has an Ag coating film on its outer surface.

7. The heat pipe according to claim 1, wherein
said container is longer than the length of an electronic component to be cooled, and
said container includes a plurality of heat radiating fins at regions extending over said electronic component.

8. The heat pipe according to claim 1, for simultaneously cooling a plurality of electronic components arranged in a row and spaced apart from each other, comprising a plurality of heat radiating fins attached to outer surfaces of those regions of said elongated container in the longitudinal direction which are not positioned on said electronic components.

9. The heat pipe according to claim 1, wherein both side walls have said inwardly concave shape with outwardly reaching side wall edges connected to said top and bottom walls, whereby four inwardly open capillary grooves are formed for transporting heat carrier fluid by capillary action.

* * * * *

UNITED STATES PATENT AND TRADEMARK OFFICE
CERTIFICATE OF CORRECTION

PATENT NO. : 5,309,986
DATED : May 10, 1994
INVENTOR(S) : Satomi Itoh

It is certified that error appears in the above-indentified patent and that said Letters Patent is hereby corrected as shown below:

Column 1, line 12, replace "a" by --as--;

line 13, before "relative" insert --circuit--, after "circuit" insert --volume--;

line 22, replace "of" by --or--;

line 23, replace "into" by --inside--;

line 43, replace "been" by --to be--;

line 56, delete "a" (first occurrence).

Column 2, line 51, replace "Fig. 1" by --Fig. 3--;

line 57, replace "and" by --with--;

line 66, after ";" insert --and--;

line 68, replace "pipe" by --pipes--.

Column 3, line 8, after "container" insert --1--;
line 16, replace "The" by --These--.

Column 4, line 26, delete "integrated in the heat";

line 46, replace "tot he" by --to the--.

Signed and Sealed this

Thirteenth Day of September, 1994

Attest:

BRUCE LEHMAN

Attesting Officer

Commissioner of Patents and Trademarks